(12) United States Patent
Liu et al.

(10) Patent No.: US 11,489,132 B2
(45) Date of Patent: Nov. 1, 2022

(54) DISPLAY PANEL INCLUDING AN ORGANIC ELECTROLUMINESCENT DEVICE WHERE AN ORGANIC SMALL MOLECULE LUMINESCENT MATERIAL IS DISPOSED IN A MAIN BODY MADE OF MESOPOROUS SILICA, METHOD FOR MANUFACTURING THE SAME, AND DISPLAY DEVICE

(71) Applicant: HKC CORPORATION LIMITED, Shenzhen (CN)

(72) Inventors: Zhen Liu, Chongqing (CN); En-Tsung Cho, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 159 days.

(21) Appl. No.: 17/041,428

(22) PCT Filed: Dec. 12, 2018

(86) PCT No.: PCT/CN2018/120487
§ 371 (c)(1),
(2) Date: Sep. 24, 2020

(87) PCT Pub. No.: WO2020/113634
PCT Pub. Date: Jun. 11, 2020

(65) Prior Publication Data
US 2021/0020860 A1 Jan. 21, 2021

(30) Foreign Application Priority Data
Dec. 4, 2018 (CN) .......................... 201811473419.3

(51) Int. Cl.
H01L 29/08 (2006.01)
H01L 51/50 (2006.01)
H01L 51/56 (2006.01)

(52) U.S. Cl.
CPC ...... *H01L 51/5024* (2013.01); *H01L 51/5036* (2013.01); *H01L 51/5056* (2013.01); *H01L 51/5092* (2013.01); *H01L 51/56* (2013.01)

(58) Field of Classification Search
CPC .................................................. H01L 51/5024
See application file for complete search history.

(56) References Cited

U.S. PATENT DOCUMENTS 9,859,497 B2 * 1/2018 Salcedo Reyes ..... H01L 51/502
2011/0095271 A1 4/2011 Bradley
(Continued)

FOREIGN PATENT DOCUMENTS

| CN | 102460764 A | 5/2012 |
| CN | 103824877 A | 5/2014 |

(Continued)

OTHER PUBLICATIONS

Peng Zhang, the ISA written comments, dated Sep. 2019, CN.
Peng Zhang, the international Search Report, dated Sep. 2019, CN.

*Primary Examiner* — Caleb E Henry

(57) ABSTRACT

This application discloses a display panel, a method for manufacturing a display panel, and a display device. The display panel includes an organic electroluminescent device. The organic electroluminescent device includes an emission layer. The emission layer includes a main body made of mesoporous silica and a dopant made of an organic small molecule luminescent material. The dopant is arranged in the main body.

17 Claims, 12 Drawing Sheets

(56) References Cited

U.S. PATENT DOCUMENTS

| | | | | |
|---|---|---|---|---|
| 2016/0343948 | A1* | 11/2016 | Salcedo Reyes | ... H01L 51/5024 |
| 2017/0117444 | A1* | 4/2017 | Stoll | ................... H01L 51/5281 |
| 2017/0362579 | A1* | 12/2017 | Zheng | .................. C12N 9/0006 |
| 2018/0019411 | A1* | 1/2018 | Otsuki | ................ H01L 51/0072 |
| 2018/0050220 | A1* | 2/2018 | Sepahvandi | ............ A61L 27/26 |

FOREIGN PATENT DOCUMENTS

| | | |
|---|---|---|
| CN | 105720176 A | 6/2016 |
| CN | 106449720 A | 2/2017 |
| CN | 107689388 A | 2/2018 |
| CN | 108565349 A | 9/2019 |

* cited by examiner

DISPLAY PANEL INCLUDING AN ORGANIC ELECTROLUMINESCENT DEVICE WHERE AN ORGANIC SMALL MOLECULE LUMINESCENT MATERIAL IS DISPOSED IN A MAIN BODY MADE OF MESOPOROUS SILICA, METHOD FOR MANUFACTURING THE SAME, AND DISPLAY DEVICE

CROSS REFERENCE OF RELATED APPLICATIONS

This application claims the priority to the Chinese Patent Application No. CN201811473419.3, filed with National Intellectual Property Administration, PRC on Dec. 4, 2018 and entitled "DISPLAY PANEL, METHOD FOR MANUFACTURING DISPLAY PANEL, AND DISPLAY DEVICE", which is incorporated herein by reference in its entirety.

TECHNICAL FIELD

This application relates to the field of display technologies, and in particular, to a display panel, a method for manufacturing a display panel, and a display device.

BACKGROUND

The description herein provides only background information related to this application, but does not necessarily constitute the conventional art.

Organic Light Emitting Diode or Organic Light Emitting Diode Display (OLED), or referred to as organic electroluminescent diode, is a novel display technology developed since the mid-20$^{th}$ century. Compared with a liquid crystal display, the organic electroluminescent diode has the advantages of all solid state, active light emission, high brightness, high contrast, thin thickness, low costs, low power consumption, fast response, wide viewing angle, wide operating temperature range, and soft screen display. According to molecular sizes, organic light-emitting materials may include small molecule materials and high polymer materials.

Generally, organic light emitting molecules suffer from a severe aggregation-caused quenching effect.

SUMMARY

To achieve the foregoing objective, this application provides a display panel, a method for manufacturing a display panel, and a display device, to reduce aggregation of organic light emitting molecules.

This application discloses a display panel. The display panel includes an organic electroluminescent device. The organic electroluminescent device includes an emission layer. The emission layer includes a main body made of mesoporous silica and a dopant made of an organic small molecule luminescent material. The dopant is arranged in the main body.

Optionally, the organic electroluminescent device includes: a substrate; an anode layer, arranged on a surface of the substrate; a hole injection layer, arranged on a surface of the anode layer; a hole transport layer, arranged on a surface of the hole injection layer; an emission layer, arranged on a surface of the hole transport layer; an electron output layer, arranged on a surface of the emission layer; an electron injection layer, arranged on a surface of the electron output layer; and a cathode layer, arranged on a surface of the electron injection layer and electrically connected to the anode layer.

Optionally, a molecular weight of the organic small molecule luminescent material is less than or equal to 2000.

Optionally, the main body includes a plurality of cylindrical holes, the holes run through the main body, and the holes are filled with the organic small molecule luminescent material.

Optionally, an outer wall of the main body is regular hexagonal.

Optionally, the organic small molecule luminescent material includes an organic small molecule red-light emitting material, an organic small molecule green-light emitting material, and an organic small molecule blue-light emitting material, the emission layer includes a plurality of illuminants, and each of the illuminants is made of a mixture of the organic small molecule red-light emitting material, the organic small molecule green-light emitting material, and the organic small molecule blue-light emitting material.

Optionally, the organic small molecule red-light emitting material, the organic small molecule green-light emitting material, and the organic small molecule blue-light emitting material are mixed in a same layer of the illuminant.

Optionally, the organic small molecule luminescent material includes an organic small molecule red-light emitting material, an organic small molecule green-light emitting material, and an organic small molecule blue-light emitting material, the emission layer includes a plurality of illuminants, each of the illuminants includes a red emission layer, a green emission layer, and a blue emission layer, the red emission layer is made of the organic small molecule red-light emitting material, the green emission layer is made of the organic small molecule green-light emitting material, and the blue emission layer is made of the organic small molecule blue-light emitting material.

Optionally, positions of the red emission layer, the green emission layer, and the blue emission layer in a same illuminant are exchangeable.

Optionally, the display panel is an organic light emitting display panel.

Optionally, no reaction occurs between the main body and the dopant.

This application further discloses a method for manufacturing a display panel. The display panel includes an organic electroluminescent device. The organic electroluminescent device includes an emission layer. The manufacturing method includes a step of molding the emission layer: arranging an organic small molecule luminescent material in a main body material made of mesoporous silica, to form the emission layer.

Optionally, the step of molding the emission layer includes:

a mixing step: mixing the organic small molecule luminescent material with the mesoporous silica by using a solvent, to form a mixture; and a molding step: coating the mixture onto a hole transport layer of the organic electroluminescent device, to form the emission layer through baking.

Optionally, the mixing step includes:

mixing the organic small molecule luminescent material with a first solvent to form a first mixture;

mixing the mesoporous silica with a second solvent to form a second mixture; and mixing the first mixture with the second mixture to form the mixture.

Optionally, no chemical reaction occurs between the first solvent and the second solvent.

Optionally, the mixture of the organic small molecule luminescent material and the mesoporous silica is baked at a temperature of 250 to 350 degrees Celsius for 0.5 to 5 hours.

This application further discloses a display device, including the foregoing display panel and a driving apparatus configured to drive the display panel.

Compared with a solution in which the emission layer includes another type of organic light-emitting material, in this application, the organic small molecule luminescent material is arranged in the main body made of the mesoporous silica, to effectively disperse the organic small molecule luminescent material, and reduce the probability of aggregating into clusters. In addition, the combination of organic small molecules and inorganic silica prolongs the overall service life of the device.

BRIEF DESCRIPTION OF DRAWINGS

The drawings included are used for providing understanding of embodiments of this application, constitute part of the specification, and are used for illustrating implementations of this application, and interpreting principles of this application together with text description. Apparently, the accompanying drawings in the following description show merely some embodiments of this application, and a person of ordinary skill in the art may still derive other drawings from these accompanying drawings without creative efforts. In the figures.

DETAILED DESCRIPTION OF EMBODIMENTS

Figure 1:
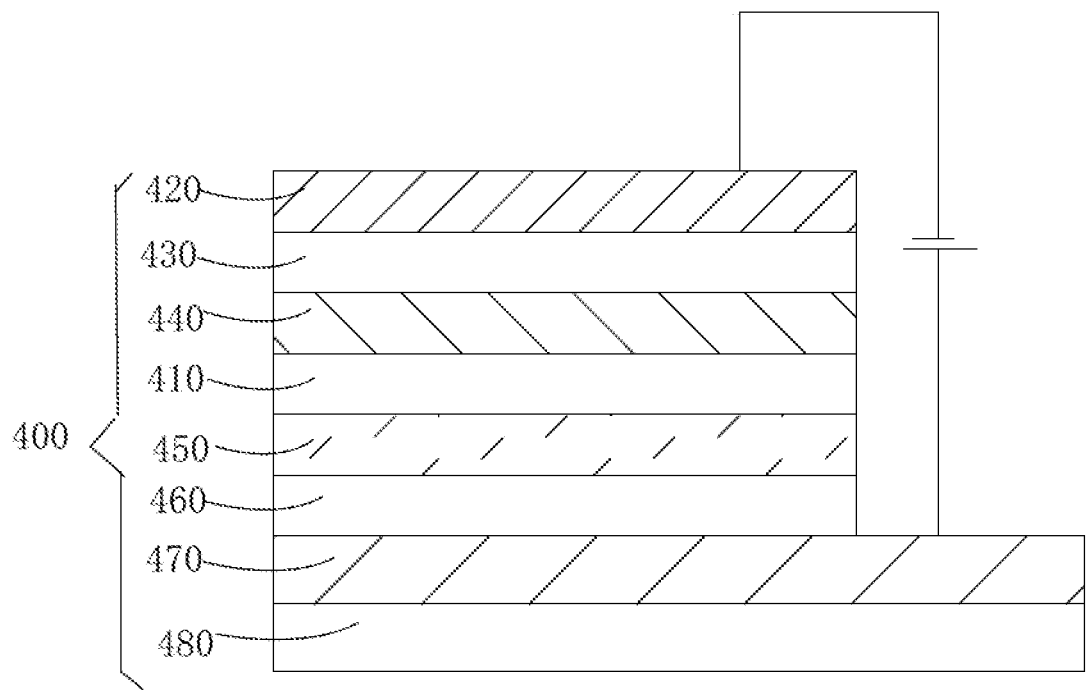
FIG. 1 is a schematic diagram of an organic electroluminescent device according to an embodiment of this application.

It should be understood that terms used herein, specific structures and functional details disclosed herein are merely for describing specific embodiments and are representative. However, this application may be specifically implemented in many alternative forms, and should not be construed as being limited to the embodiments set forth herein.

In the description of this application, the terms such as "first" and "second" are used only for the purpose of description, and should not be understood as indicating the relative importance or implicitly specifying the quantity of the indicated technical features. Therefore, unless otherwise stated, a feature defined by "first" or "second" can explicitly or implicitly include one or more features; and "a plurality of" means two or more. The terms "include", "comprise", and any variant thereof are intended to cover non-exclusive inclusion, and do not preclude the presence or addition of one or more other features, integers, steps, operations, elements, components, and/or combinations thereof.

In addition, terms indicating orientation or position relationships, for example, "center", "transverse", "on", "below", "left", "right", "vertical", "horizontal", "top", "bottom", "inside", and "outside" are described based on orientation or relative position relationships shown in the accompanying drawings, and are used only for ease and brevity of description of this application, rather than indicating that the mentioned apparatus or component needs to have a particular orientation or needs to be constructed and operated in a particular orientation. Therefore, such terms should not be construed as limiting of this application.

In addition, unless otherwise explicitly specified or defined, the terms such as "mount", "install", "connect", and "connection" should be understood in a broad sense. For example, the connection may be a fixed collection, a detachable connection, or an integral connection; or the connection may be a mechanical connection or an electrical connection; or the connection may be a direct connection, an indirect connection through an intermediary, or internal communication between two components. A person of ordinary skill in the art may understand the specific meanings of the foregoing terms in this application according to specific situations.

This application is specifically described below with reference to the accompanying drawings and optional embodiments.

As shown in FIG. 1 to FIG. 10, an embodiment of this application discloses a display panel 200. The display panel 200 includes an organic electroluminescent device 400. The organic electroluminescent device 400 includes an emission layer 410. The emission layer 410 includes a main body 411 made of mesoporous silica 413 and a dopant 412 made of an organic small molecule luminescent material 414. The dopant 412 is arranged in the main body 411. No reaction occurs between the main body 411 and the dopant 412. In this solution, the organic small molecule luminescent material 414 is arranged in the main body 411 made of the mesoporous silica 413, to effectively disperse the organic small molecule luminescent material 414, and reduce the probability of aggregating into clusters. In addition, the combination of organic small molecules and inorganic silica prolongs the overall service life of the device. The display panel 200 is an Organic Light Emitting Diode (OLED) display panel.

In one or more embodiments, as shown in FIG. 1, the organic electroluminescent device 400 includes: a substrate 480; an anode layer 470 arranged on a surface of the substrate 480; a hole injection layer 460 arranged on a surface of the anode layer 470; a hole transport layer 450 arranged on a surface of the hole injection layer 460: an emission layer 410 arranged on a surface of the hole transport layer 450; an electron output layer 440 arranged on a surface of the emission layer 410; an electron injection layer 430 arranged on a surface of the electron output layer 440; and a cathode layer 420 arranged on a surface of the electron injection layer 430 and electrically connected to the anode layer 470.

In one or more embodiments, a molecular weight of the organic small molecule luminescent material 414 is less than or equal to 2000. In this solution, because the organic light-emitting material needs to be arranged in the main body 411 made of the mesoporous silica 413, and apertures of mesopores range from 2 to 50 nm, it is difficult to fill the organic light-emitting material into the mesoporous material if the organic light-emitting material has an excessively large molecular weight. The molecular weight of 2000 exactly meets the filling requirements.

Figure 2:
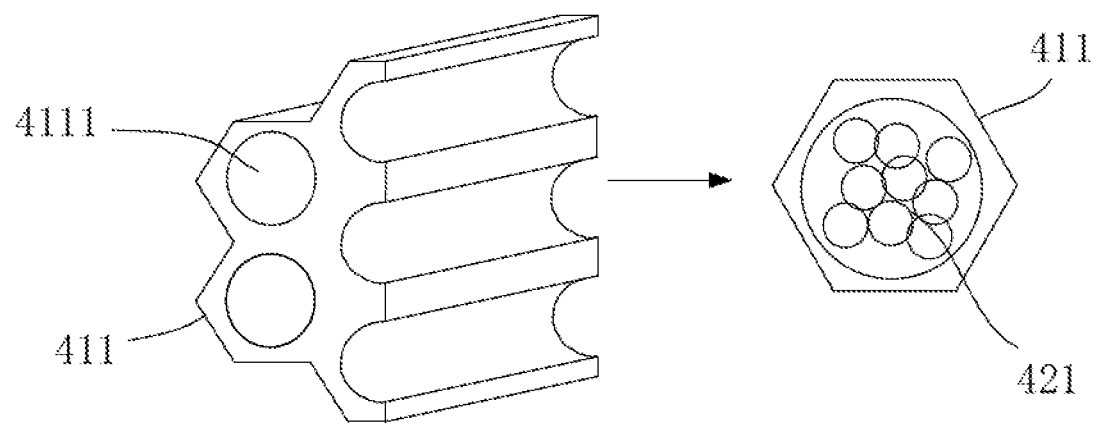
FIG. 2 is a schematic diagram of an emission layer according to an embodiment of this application.

In one or more embodiments, as shown in FIG. 2, the main body 411 includes a plurality of cylindrical holes 4111. The holes 4111 run through the main body 411. The holes 4111 are filled with the organic small molecule luminescent material 414. In this solution, the use of the structures of the holes 4111 facilitates the implementation using a self-assembly molecular template solution. The holes 4111 may be cylindrical, or may be polygonal. According to different manufacturing processes and product requirements, the structures of the holes 4111 may be manufactured into different shapes. Therefore, the structures of the holes 4111 of various shapes all fall within the scope of the concept of the implementation.

An outer wall of the main body 411 is regular hexagonal.

Figure 3:
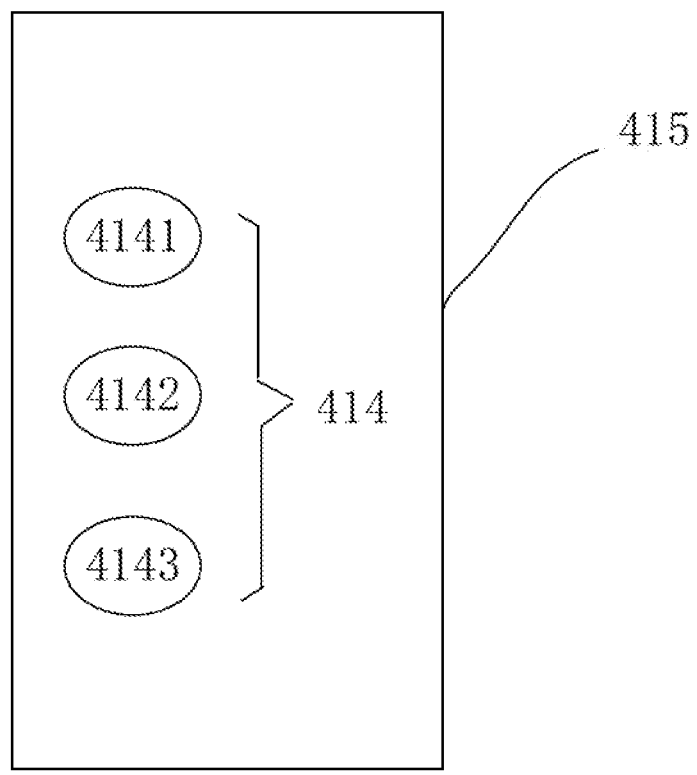
FIG. 3 is a schematic diagram of an illuminant according to an embodiment of this application.

In one or more embodiments, as shown in FIG. 3, the organic small molecule luminescent material 414 includes an organic small molecule red-light emitting material 4141, an organic small molecule green-light emitting material 4142, and an organic small molecule blue-light emitting material 4143. The emission layer 410 includes a plurality of illuminants 415. Each of the illuminants 415 is made of a mixture of the organic small molecule red-light emitting material 4141, the organic small molecule green-light emitting material 4142, and the organic small molecule blue-light emitting material 4143. In this solution, the organic small molecule red-light emitting material 4141, the organic small molecule green-light emitting material 4142, and the organic small molecule blue-light emitting material 4143 are mixed to form each illuminant 415, so that each illuminant 415 can emit light in three colors, namely, red, green, and blue. The mixing form simplifies the processing process, and organic small molecule materials in three colors do not need to be separately layered, thereby reducing the processing time of the emission layer 410.

In one or more embodiments, the organic small molecule red-light emitting material 4141, the organic small molecule green-light emitting material 4142, and the organic small molecule blue-light emitting material 4143 are mixed in a same layer of the illuminant 415.

Figure 4:
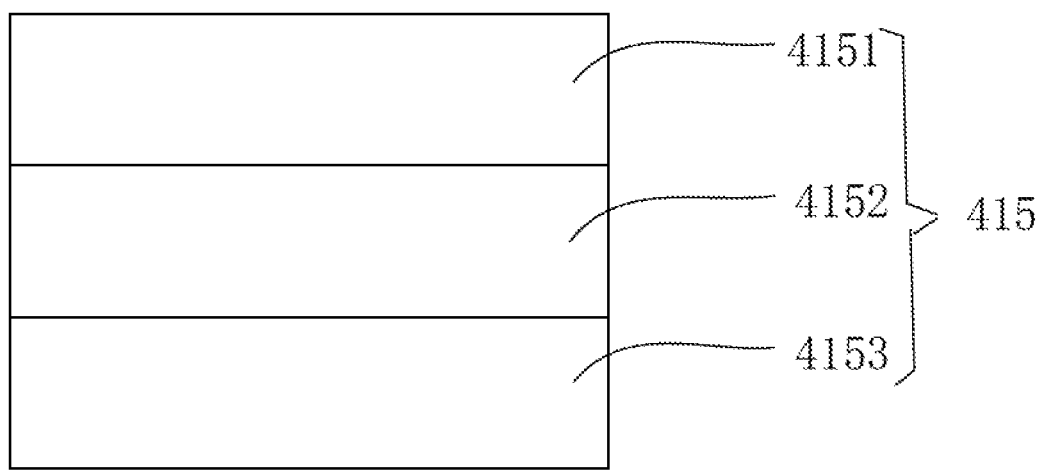
FIG. 4 is a schematic diagram of another illuminant according to an embodiment of this application.
Figure 5:
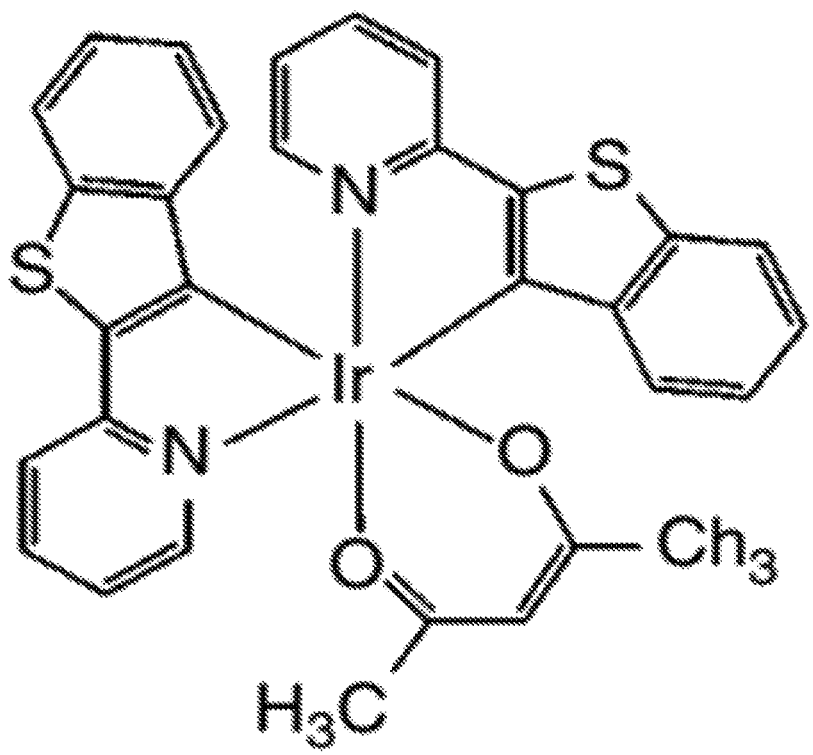
FIG. 5 is a schematic diagram of an organic small molecule red-light emitting material according to an embodiment of this application.
Figure 6:
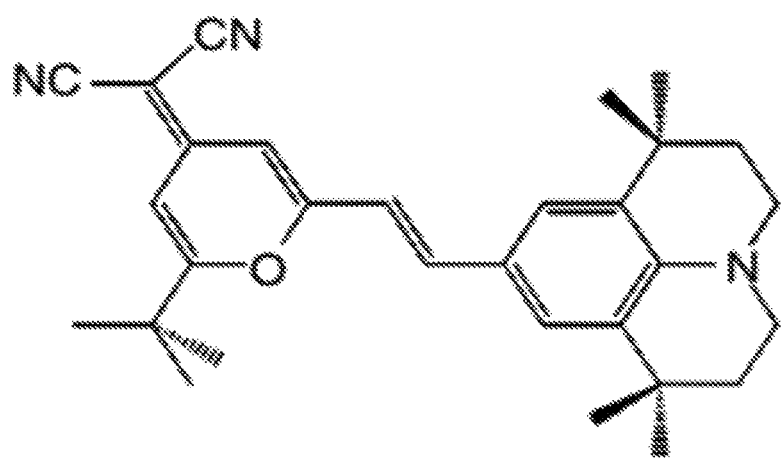
FIG. 6 is a schematic diagram of another organic small molecule red-light emitting material according to an embodiment of this application.
Figure 7:
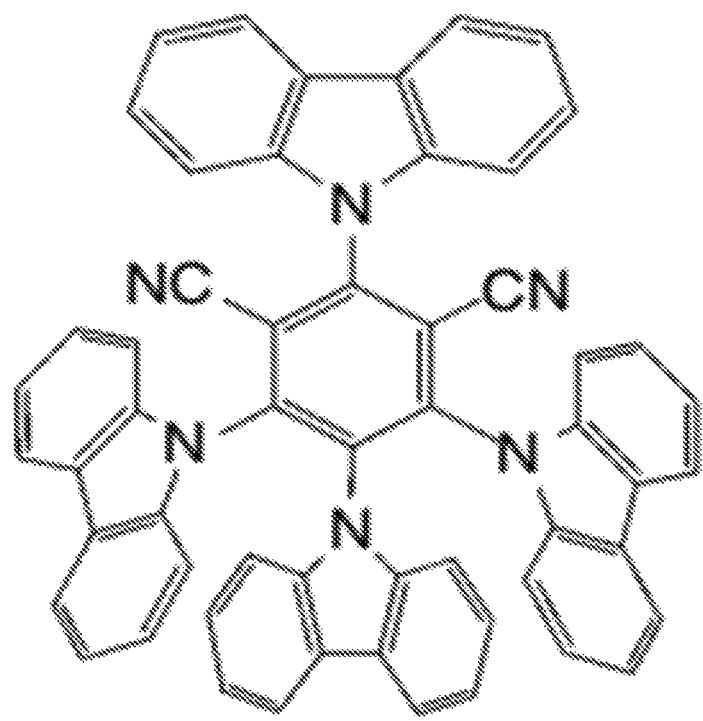
FIG. 7 is a schematic diagram of an organic small molecule green-light emitting material according to an embodiment of this application.
Figure 8:
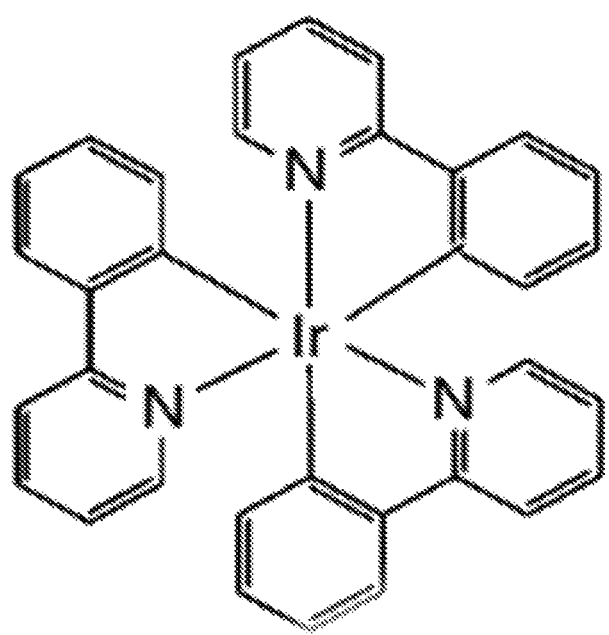
FIG. 8 is a schematic diagram of another organic small molecule green-light emitting material according to an embodiment of this application.
Figure 9:
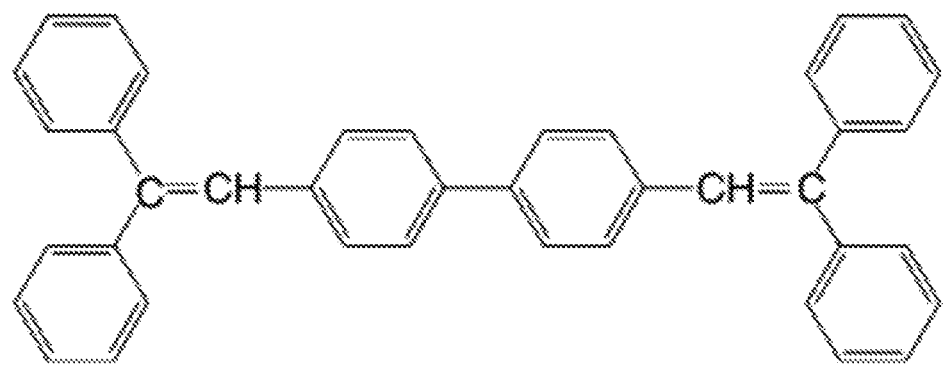
FIG. 9 is a schematic diagram of an organic small molecule blue-light emitting material according to an embodiment of this application.
Figure 10:
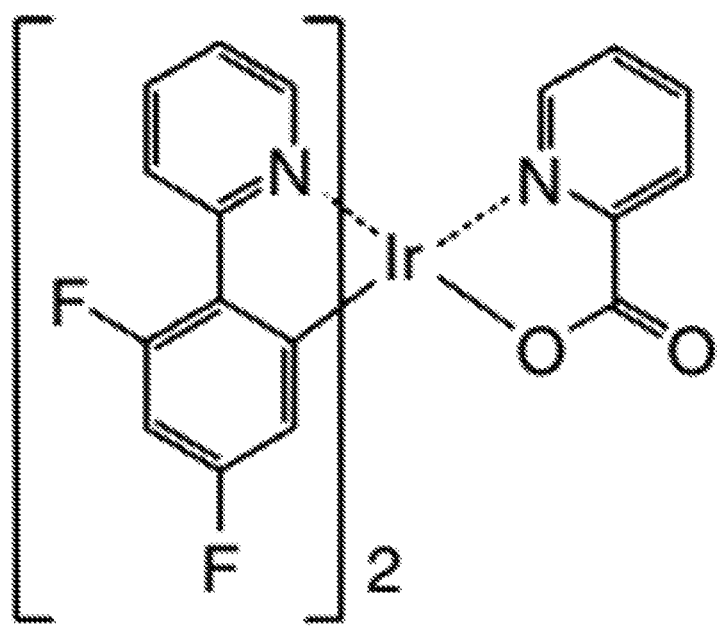
FIG. 10 is a schematic diagram of another organic small molecule blue-light emitting material according to an embodiment of this application.

In one or more embodiments, as shown in FIG. 4, the organic small molecule luminescent material 414 includes an organic small molecule red-light emitting material 4141, an organic small molecule green-light emitting material 4142, and an organic small molecule blue-light emitting material 4143. The emission layer 410 includes a plurality of illuminants 415. Each of the illuminants 415 includes a red emission layer 4151, a green emission layer 4152, and a blue emission layer 4153. The red emission layer 4151 is made of the organic small molecule red-light emitting material 4141. The green emission layer 4152 is made of the organic small molecule green-light emitting material 4142. The blue emission layer 4153 is made of the organic small molecule blue-light emitting material 4143. In this solution, each illuminant 415 is divided into three layers, namely, the red emission layer 4151, the green emission layer 4152, and the blue emission layer 4153. Such a division of the illuminant 415 into smaller units facilitates adjustment and control of each illuminant 415, so that the emission layers 410 in three different colors in each illuminant 415 are evenly distributed, improving the display effect. In addition, if a problem occurs in the illuminant 415, corresponding modifications may be made.

In one or more embodiments, positions of the red emission layer 4151, the green emission layer 4152, and the blue emission layer 4153 in a same illuminant 415 are exchangeable.

In one or more embodiments, the organic small molecule red-light emitting material 4141 includes two red phosphorescent materials, namely: 2-{2-tert-butyl-6-[2-(1,1,7,7-tetramethyl-2,3,6,7-tetrahydro-1H,5H-pyrido[3,2,1-ij]quinolin-9-yl)-vinyl]-pyran-4-ylidene}-malononitrile whose English name is (btp)2lr(acac); and 4-(dicyanomethylene)-2-tert-butyl-6-(1,1,7,7-tetramethyl-julolidyl-4-vinyl)-4H-pyran whose English name is DCJTB. Chemical structures of the two materials are respectively shown in FIG. 5 and FIG. 6. In this solution, the two materials provided can meet the requirements of this application on color and molecular size.

In one or more embodiments, the organic small molecule green-light emitting material 4142 includes two green phosphorescent materials, namely: 2,4,5,6-tetra(9-carbazolyl) iso-phthalonitrile whose English name is 4CzIPN; and tris (2-phenyl pyridinato)iridium whose English name is lr(ppy)3. Chemical structures of the two materials are respectively shown in FIG. 7 and FIG. 8. In this solution, the two materials provided can meet the requirements of this application on color and molecular size.

In one or more embodiments, the organic small molecule blue-light emitting material 4143 includes two blue phosphorescent materials, namely: 4,4'-bis(2,2-diphenylvinyl)-1, 1'-biphenyl whose English name is DPVBl: and bis[(4,6-difluorophenyl)-pyridinato-N,C2'] (picolinate) iridium whose English name is Flrpic. Chemical structures of the two materials are respectively shown in FIG. 9 and FIG. 10. In this solution, the two materials provided can meet the requirements of this application on color and molecular size.

Figure 11:
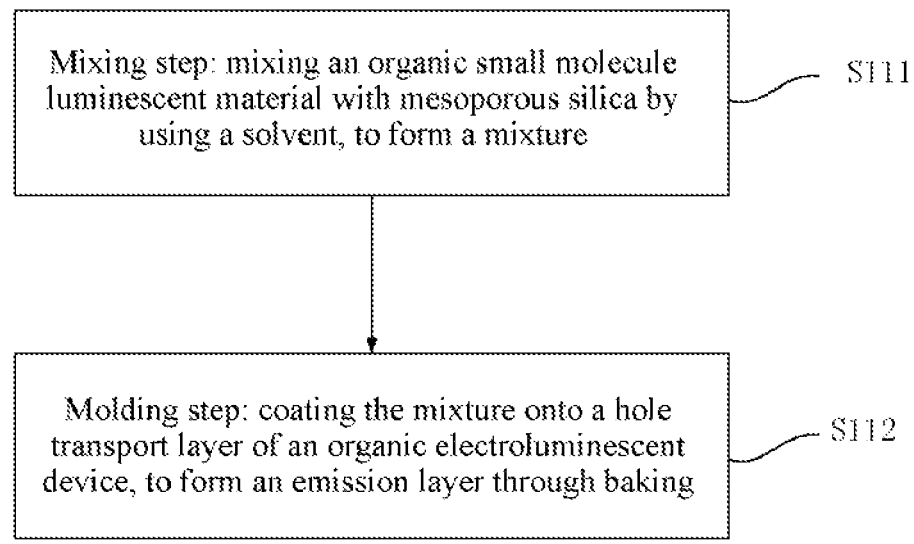
FIG. 11 is a flowchart of a method for manufacturing a display panel according to an embodiment of this application.
Figure 12:
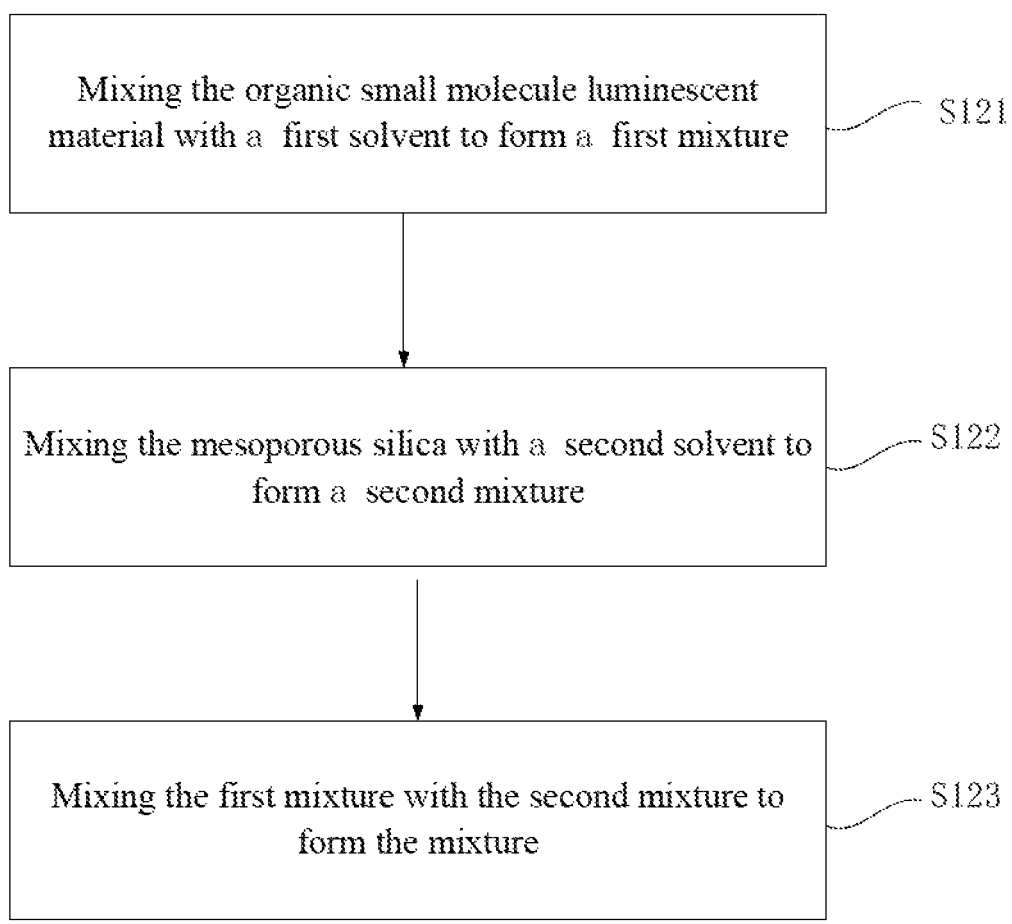
FIG. 12 is a flowchart of a mixing step in a method for manufacturing a display panel according to an embodiment of this application.

As shown in FIG. 11 and FIG. 12, in one or more embodiments of this application, a method for manufacturing a display panel 200 is disclosed. The display panel 200 includes an organic electroluminescent device 400. The organic electroluminescent device 400 includes an emission layer 410. The manufacturing method includes a step of molding the emission layer 410: arranging an organic small molecule luminescent material in a main body material made of mesoporous silica, to form the emission layer.

In one or more embodiments, as shown in FIG. 11, the step of molding the emission layer 410 includes:

S111: a mixing step: mixing the organic small molecule luminescent material with the mesoporous silica by using a solvent, to form a mixture; and S112: a molding step: coating the mixture onto a hole transport layer of the organic electroluminescent device, to form the emission layer through baking.

In this solution, a thermal evaporation method is generally used for existing industrial organic small molecules. A thermal evaporation device requires high costs, and has great limitations in manufacturing a large-area panel. Therefore, the use of the solution method can reduce the costs, is suitable for manufacturing of a large-size panel, and can simplify the manufacturing process. In addition, moisture in the foregoing mixture 500 is evaporated through baking, to obtain a final emission layer 410. The baking does not affect the state of the combination of the mesoporous silica 413 and the organic small molecule luminescent material 414, and does not cause the mixture 500 to react.

In one or more embodiments, as shown in FIG. 12, the mixing step includes:

S121: mixing the organic small molecule luminescent material with a first solvent to form a first mixture;

S122: mixing the mesoporous silica with a second solvent to form a second mixture; and S123: mixing the first mixture with the second mixture to form the mixture.

Figure 13:
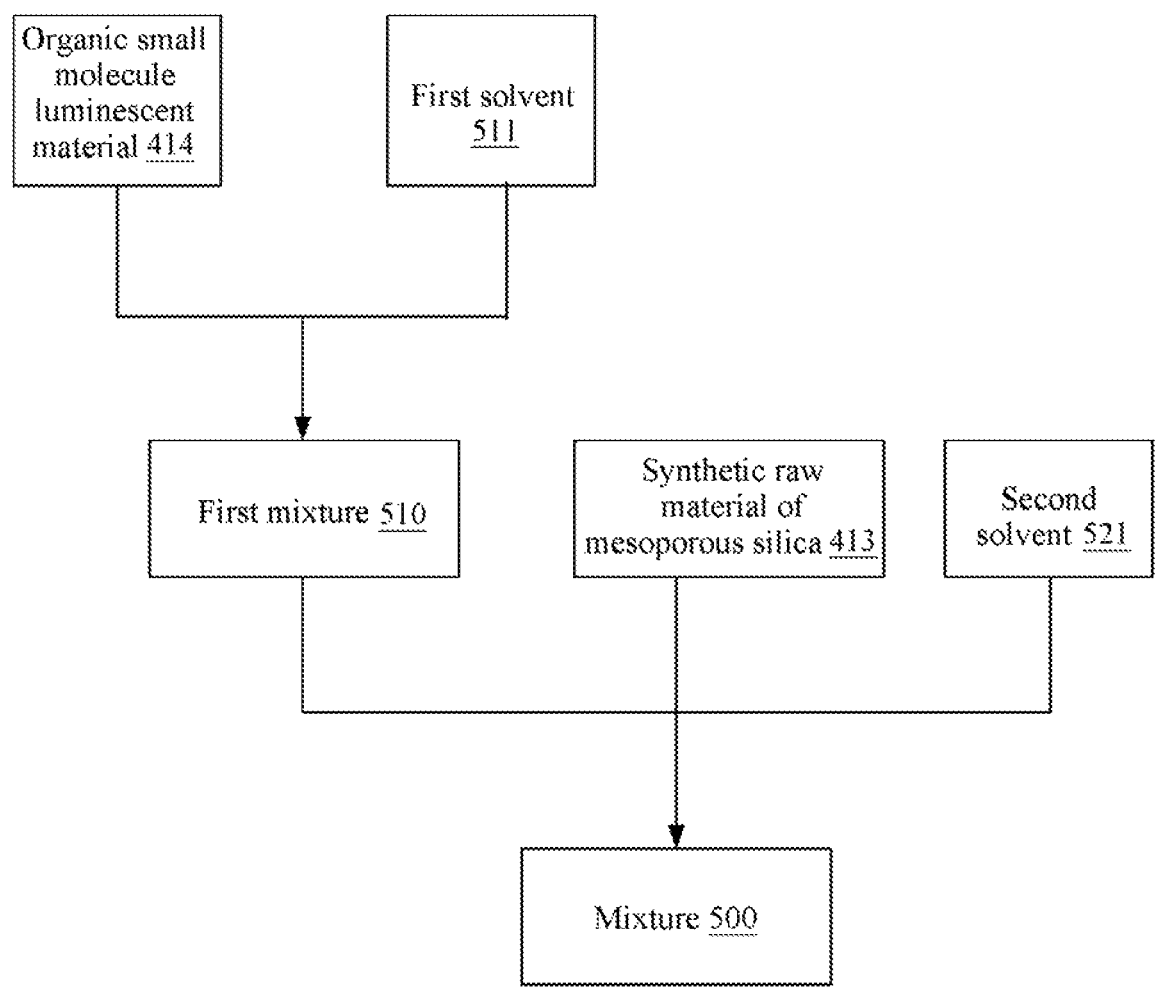
FIG. 13 is a schematic diagram of a mixing step in a method for manufacturing a display panel according to an embodiment of this application.
Figure 14:
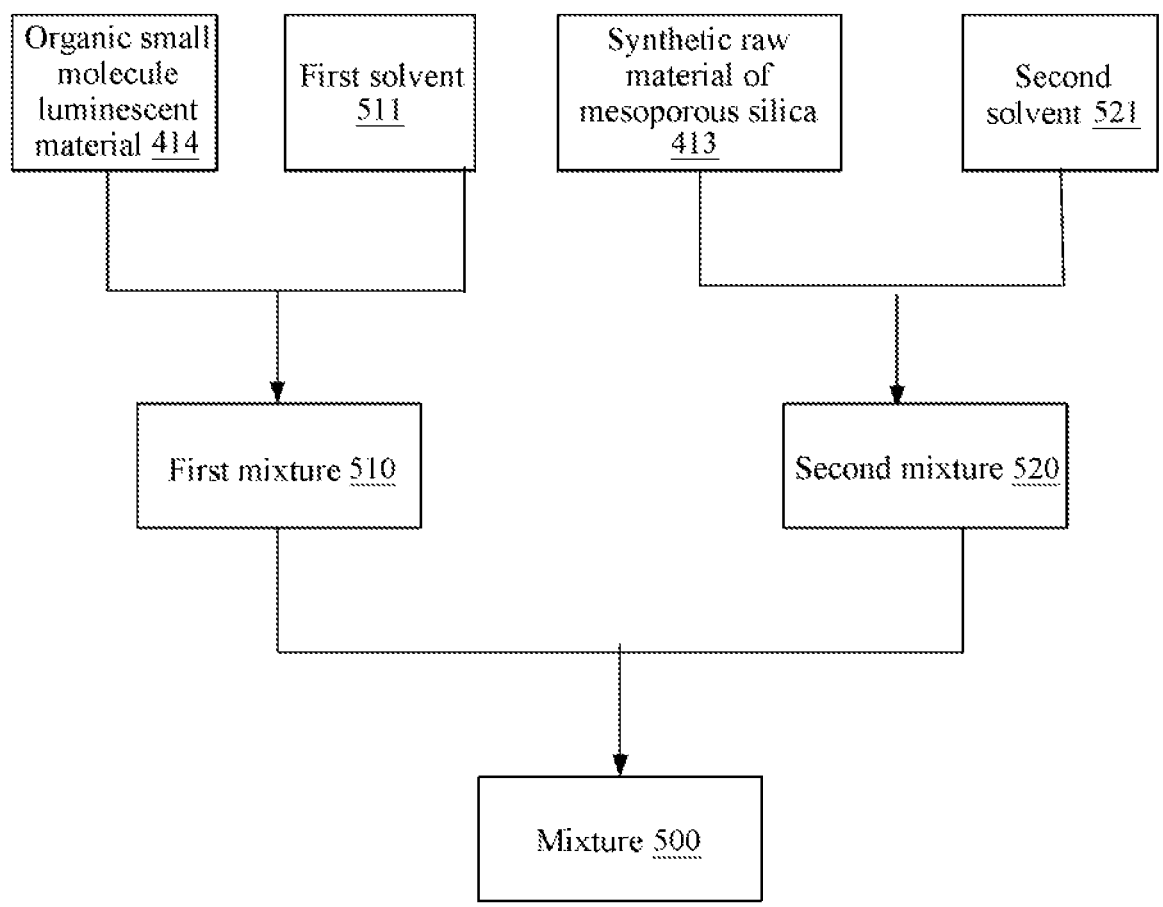
FIG. 14 is a schematic diagram of a mixing step in a method for manufacturing a display panel according to an embodiment of this application.

As shown in FIG. 13 and FIG. 14, the order of the first two steps is not fixed; and no chemical reaction occurs between the first solvent 511 and the second solvent 521. In this solution, the organic small molecule luminescent material 414 is first mixed with the first solvent 511, so that the organic small molecule luminescent material 414 is evenly distributed in the first solvent 511. The mesoporous silica 413 and the second solvent 521 are added into the organic small molecule luminescent solution that is evenly mixed, so that the mesoporous silica 413 is in even contact with the organic small molecule luminescent material 414, to avoid the case in which some mesoporous silica 413 is in contact with a relatively large quantity of the organic small molecule luminescent material 414 but some mesoporous silica 413 is in contact with only a relatively small quantity of the luminescent material. In addition, adding the second solvent 521 can dilute the organic small molecule luminescent material 414 and the mesoporous silica 413, maintaining the even distribution of the two.

In one or more embodiments, the mixture 500 of the organic small molecule luminescent material 414 and the mesoporous silica 413 is baked at a temperature of 250 to 350 degrees Celsius for 0.5 to 5 hours. In this solution, the baking temperature is set to 250 to 350 degrees Celsius and the time is set to 0.5 to 5 hours because such a condition is relatively mild and does not destroy the structure of the organic small molecule luminescent material 414 and the mesoporous silica 413.

Figure 15:
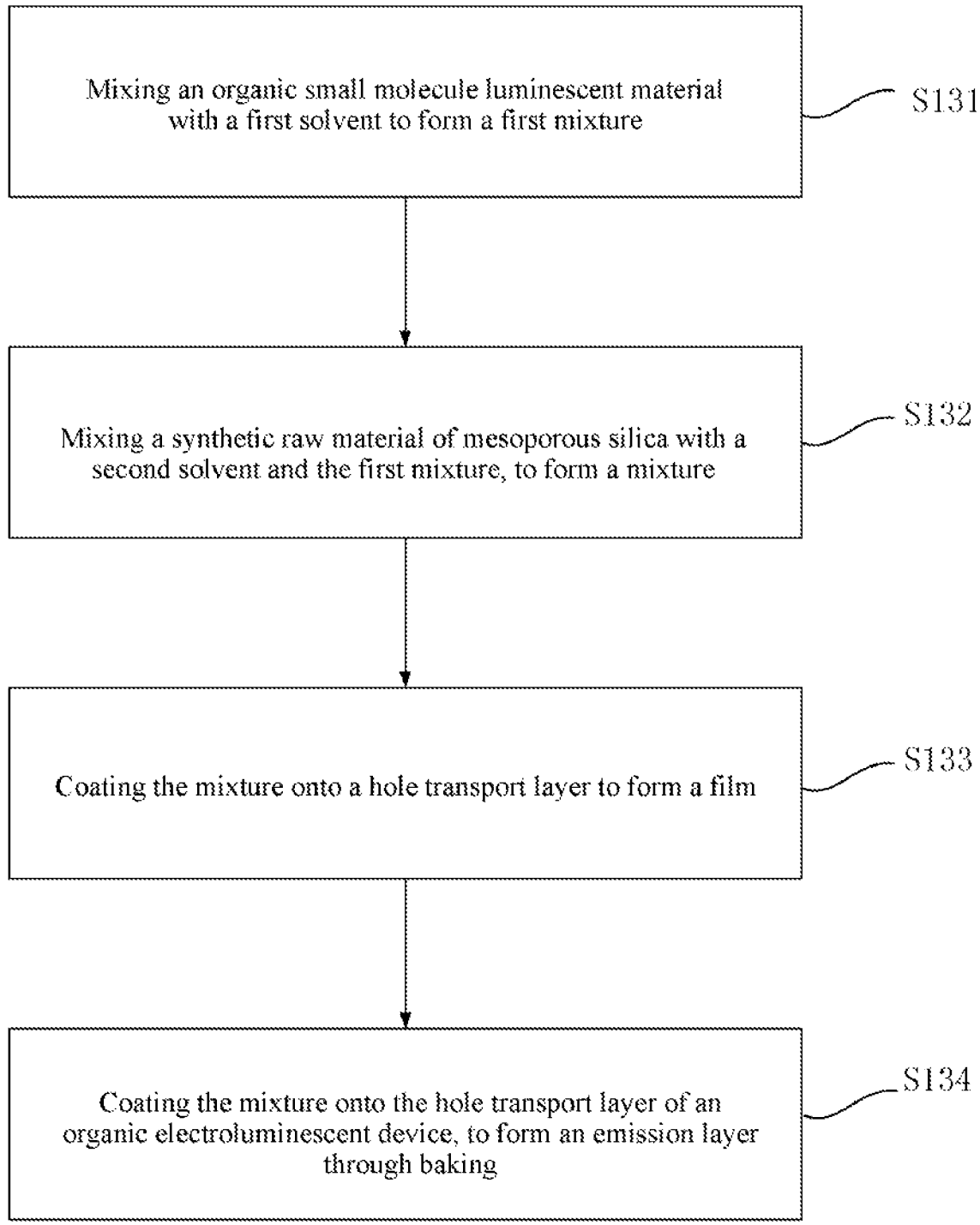
FIG. 15 is a flowchart of a method for manufacturing a display panel according to an embodiment of this application.

As shown in FIG. 15, in one or more embodiments of this application, a method for manufacturing a display panel 200 is further disclosed. The manufacturing method includes:

S131: mixing an organic small molecule luminescent material with a first solvent to form a first mixture;

S132: mixing a synthetic raw material of mesoporous silica with a second solvent and the first mixture, to form a mixture;

S133: coating the mixture onto a hole transport layer to form a film; and

S134: coating the mixture onto the hole transport layer of an organic electroluminescent device, to form an emission layer through baking.

Figure 16:
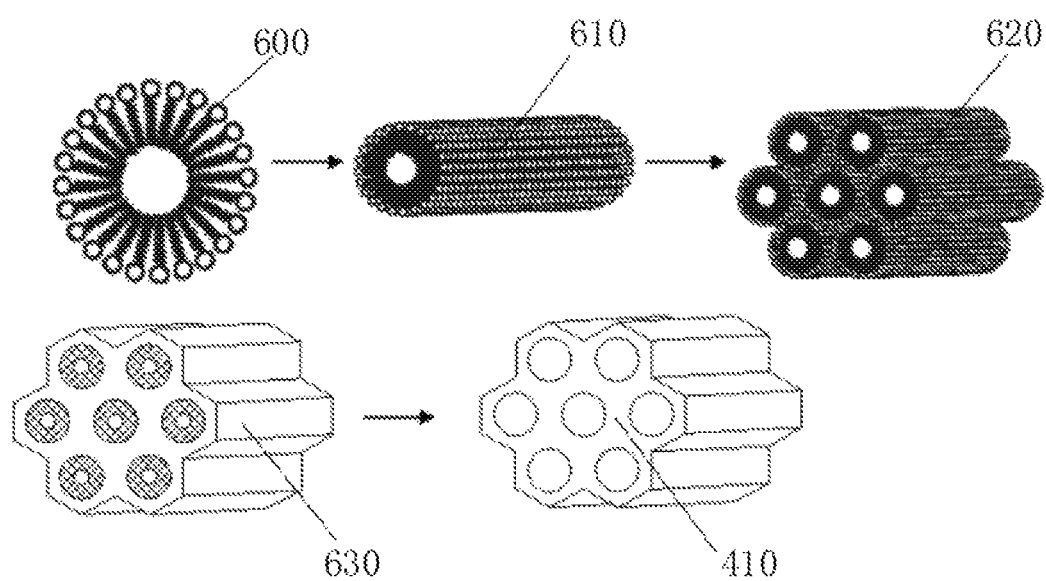
FIG. 16 is a schematic diagram of another method for manufacturing a display panel according to an embodiment of this application.
Figure 17:
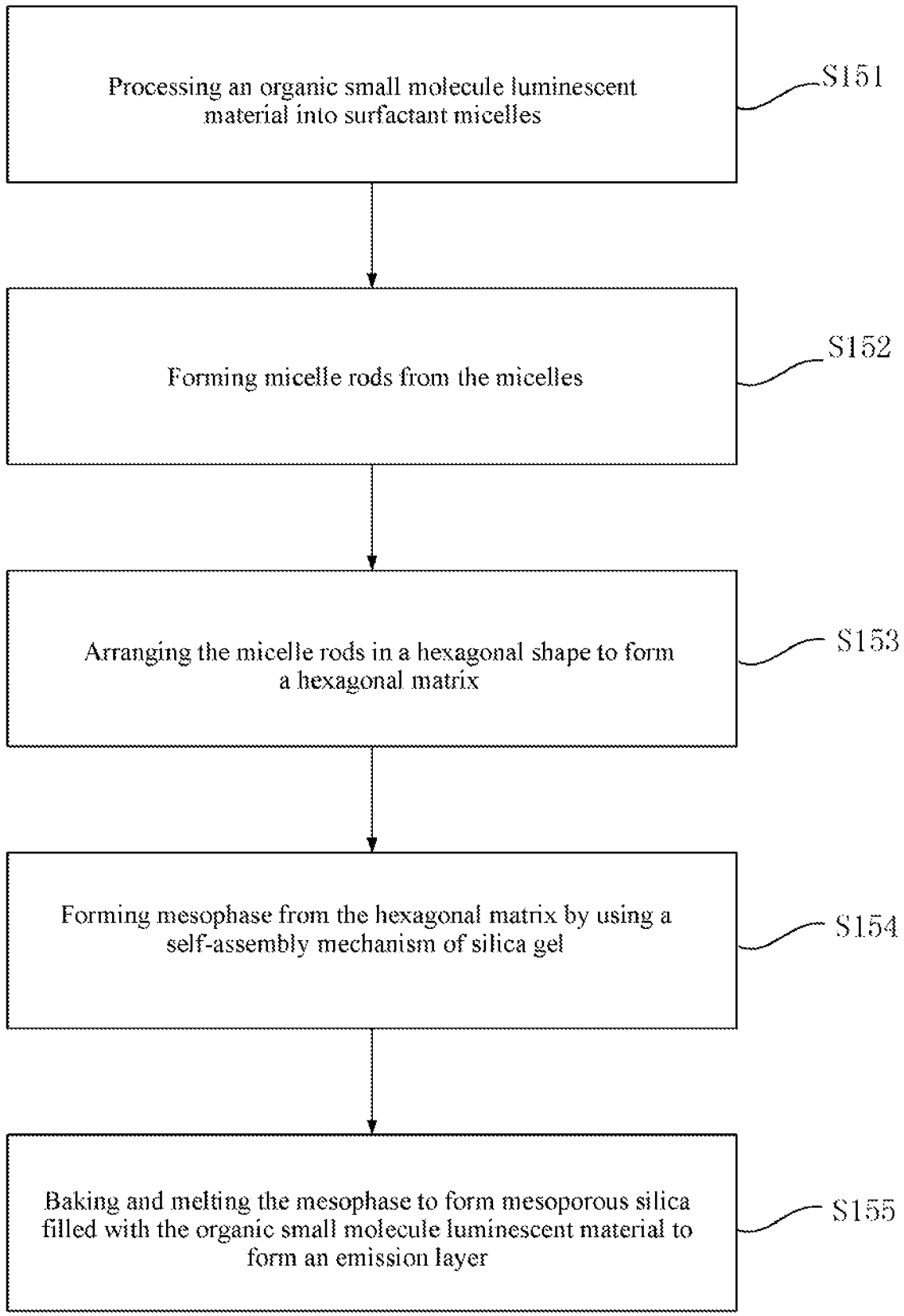
FIG. 17 is a flowchart of another method for manufacturing a display panel according to an embodiment of this application.

As shown in FIG. 16 and FIG. 17, in one or more embodiments of this application, a method for manufacturing a display panel 200 is further disclosed. The manufacturing method includes:

S151: processing an organic small molecule luminescent material into surfactant micelles;

S152: forming micelle rods from the micelles;

S153: arranging the micelle rods in a hexagonal shape to form a hexagonal matrix:

S154: forming mesophase from the hexagonal matrix by using a self-assembly mechanism of silica gel; and S155: baking and melting the mesophase to form mesoporous silica filled with the organic small molecule luminescent material to form an emission layer.

Figure 18:
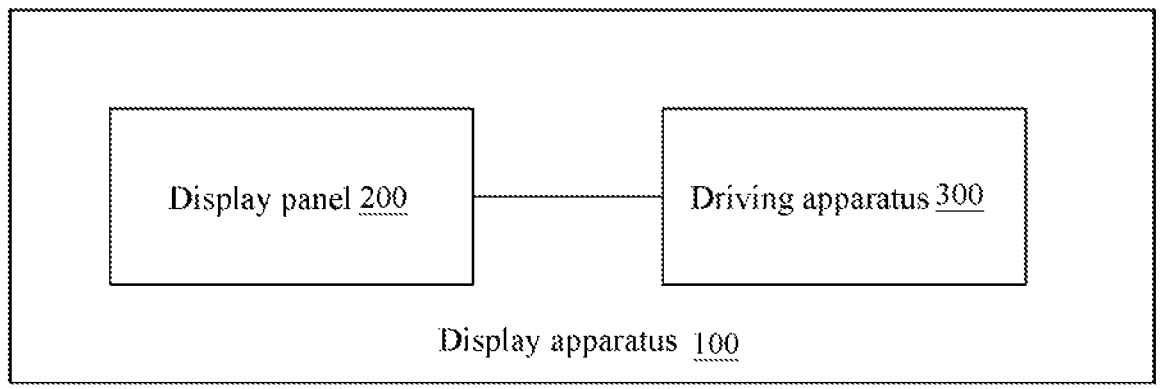
FIG. 18 is a schematic diagram of a display device according to an embodiment of this application.

As shown in FIG. 18, in one or more embodiments of this application, a display device 100 is further disclosed. The display device 100 includes the foregoing display panel 200 and a driving apparatus 300 configured to drive the display panel 200.

It should be noted that the sequence numbers of steps involved in a specific solution should not be considered as limiting the order of steps as long as the implementation of this solution is not affected. The steps appearing earlier may be executed earlier than, later than, or at the same time as those appearing later. Such implementations shall all be considered as falling within the protection scope of this application as long as this solution can be implemented.

The foregoing contents are detailed descriptions of this application in conjunction with specific optional embodiments, and it should not be considered that the specific implementation of this application is limited to these descriptions. A person of ordinary skill in the art can further make simple deductions or replacements without departing from the concept of this application, and such deductions or replacements should all be considered as falling within the protection scope of this application.

What is claimed is:

1. A display panel, comprising an organic electroluminescent device, wherein the organic electroluminescent device comprises an emission layer, and the emission layer comprises:
    a main body, made of mesoporous silica; and
    a dopant, made of an organic small molecule luminescent material, and arranged in the main body;
    wherein a molecular weight of the organic small molecule luminescent material is less than or equal to 2000.

2. The display panel according to claim 1, wherein the main body comprises a plurality of cylindrical holes, the holes run through the main body, and the holes are filled with the organic small molecule luminescent material.

3. The display panel according to claim 2, wherein an outer wall of the main body is regular hexagonal.

4. The display panel according to claim 1, wherein the organic small molecule luminescent material comprises an organic small molecule red-light emitting material, an organic small molecule green-light emitting material, and an organic small molecule blue-light emitting material, the emission layer comprises a plurality of illuminants, and each of the illuminants is made of a mixture of the organic small molecule red-light emitting material, the organic small molecule green-light emitting material, and the organic small molecule blue-light emitting material.

5. The display panel according to claim 4, wherein the organic small molecule red-light emitting material, the organic small molecule green-light emitting material, and the organic small molecule blue-light emitting material are mixed in a same layer of the illuminant.

6. The display panel according to claim 1, wherein the organic small molecule luminescent material comprises an organic small molecule red-light emitting material, an organic small molecule green-light emitting material, and an organic small molecule blue-light emitting material, the emission layer comprises a plurality of illuminants, each of the illuminants comprises a red emission layer, a green emission layer, and a blue emission layer, the red emission layer is made of the organic small molecule red-light emitting material, the green emission layer is made of the organic small molecule green-light emitting material, and the blue emission layer is made of the organic small molecule blue-light emitting material.

7. The display panel according to claim 6, wherein positions of the red emission layer, the green emission layer, and the blue emission layer in a same illuminant are exchangeable.

8. The display panel according to claim 1, wherein the organic electroluminescent device comprises:
   a substrate;
   an anode layer, arranged on a surface of the substrate;
   a hole injection layer, arranged on a surface of the anode layer;
   a hole transport layer, arranged on a surface of the hole injection layer;
   an emission layer, arranged on a surface of the hole transport layer;
   an electron output layer, arranged on a surface of the emission layer;
   an electron injection layer, arranged on a surface of the electron output layer; and
   a cathode layer, arranged on a surface of the electron injection layer, and electrically connected to the anode layer.

9. The display panel according to claim 1, wherein the display panel is an organic light emitting display panel.

10. The display panel according to claim 1, wherein no reaction occurs between the main body and the dopant.

11. A method for manufacturing a display panel, wherein the display panel comprises an organic electroluminescent device, the organic electroluminescent device comprises an emission layer, and the manufacturing method comprises a step of molding the emission layer: arranging an organic small molecule luminescent material in a main body material made of mesoporous silica, to form the emission layer;
   wherein the step of molding the emission layer comprises;
   a mixing step: mixing the organic small molecule luminescent material with the mesoporous silica by using a solvent, to form a mixture; and
   a molding step: coating the mixture onto a hole transport layer of the organic electroluminescent device to form the emission layer through baking.

12. The method for manufacturing a display panel according to claim 11, wherein the mixing step comprises:
   mixing the organic small molecule luminescent material with a first solvent to form a first mixture;
   mixing the mesoporous silica with a second solvent to form a second mixture; and
   mixing the first mixture with the second mixture to form the mixture.

13. The method for manufacturing a display panel according to claim 12, wherein no chemical reaction occurs between the first solvent and the second solvent.

14. The method for manufacturing a display panel according to claim 11, wherein the mixture is baked at a temperature of 250 to 350 degrees Celsius.

15. The method for manufacturing a display panel according to claim 11, wherein the mixture is baked for 0.5 to 5 hours.

16. A display device, comprising a display panel, wherein the display panel comprises an organic electroluminescent device, the organic electroluminescent device comprises an emission layer, and the emission layer comprises a main body made of mesoporous silica and a dopant made of an organic small molecule luminescent material and arranged in the main body;
   wherein a molecular weight of the organic small molecule luminescent material is less than or equal to 2000.

17. The display panel according to claim 16, wherein the main body comprises a plurality of cylindrical holes, the holes run through the main body, and the holes are filled with the organic small molecule luminescent material.

* * * * *